United States Patent
Weiser (10) Patent No.: US 10,497,630 B2
(45) Date of Patent: Dec. 3, 2019

(54) HIGH DENSITY WAFER LEVEL TEST MODULE

(71) Applicant: Texas Instruments Incorporated, Dallas, TX (US)

(72) Inventor: Doug Weiser, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/946,386

(22) Filed: Apr. 5, 2018

(65) Prior Publication Data

US 2019/0311959 A1 Oct. 10, 2019

(51) Int. Cl.
*H01L 21/66* (2006.01)
*H01L 23/528* (2006.01)
*H01L 23/522* (2006.01)
*H01L 49/02* (2006.01)

(52) U.S. Cl.
CPC ........... *H01L 22/32* (2013.01); *H01L 23/528* (2013.01); *H01L 23/5226* (2013.01); *H01L 28/20* (2013.01)

(58) Field of Classification Search
CPC ..................................................... H01L 22/32
USPC .......................................................... 257/48
See application file for complete search history.

(56) References Cited

U.S. PATENT DOCUMENTS

| | | | | |
|---|---|---|---|---|
| 2008/0116910 A1* | 5/2008 | Hung | ................. | G01R 31/2884 324/750.3 |
| 2010/0079159 A1* | 4/2010 | Kemmerling | ...... | G01R 1/07385 324/762.01 |
| 2011/0050275 A1* | 3/2011 | Mollat | ............... | G01R 31/2884 324/762.05 |
| 2012/0307030 A1* | 12/2012 | Blanquart | ......... | H01L 27/14601 348/76 |

* cited by examiner

*Primary Examiner* — Jami Valentine Miller
(74) *Attorney, Agent, or Firm* — Andrew R. Ralston; Charles A. Brill; Frank D. Cimino (57) ABSTRACT

An electronic device, e.g. an integrated circuit, includes one or more test modules each having first and second pairs of contact pads arranged along a first axis, and a third pair of contact pads arranged along a second axis parallel to the first axis. A first connection bus connects contact pads in the first pair, a second connection bus connects contact pads in the second pair, and a third connection bus connects contact pads of the third pair. A first device under test (DUT) is connected between the first connection bus and the third connection bus, and a second DUT is connected between the second connection bus and the third connection bus.

17 Claims, 7 Drawing Sheets

HIGH DENSITY WAFER LEVEL TEST MODULE

FIELD

This disclosure relates to the field of semiconductor devices, and more particularly, but not exclusively, to high-density test modules for inline testing of wafer-level electrical parameters.

BACKGROUND

During manufacturing, integrated circuits are tested at various points in the process flow to ensure compliance with various electrical parameters. Test modules may be placed within a circuit die or in a wafer scribe line between neighboring dies for wafer-level parametric test. A typical test module includes a number of contact pads each connected to a device under test (DUT). These modules consume area on the wafer, and compete for space with other needed structures, such as circuit elements and alignment marks used during photolithography.

SUMMARY

The inventors disclose various methods and devices that may be beneficially applied to manufacturing integrated circuits (ICs) with improved parametric test modules. While such embodiments may be expected to reduce space needed for such modules, or provide more DUTs in a same space, no particular result is a requirement of the described invention(s) unless explicitly recited in a particular claim.

The present disclosure introduces an electronic device, e.g. an integrated circuit. In various embodiments the device includes first and second pairs of contact pads arranged along a first axis, and a third pair of contact pads arranged along a second axis parallel to the first axis. A first connection bus connects contact pads in the first pair, a second connection bus connects contact pads in the second pair, and a third connection bus connects contact pads of the third pair. A first device under test (DUT) is connected between the first connection bus and the third connection bus, and a second DUT is connected between the second connection bus and the third connection bus.

Another embodiment provides a parametric test module, located over a semiconductor device substrate, that includes a pair of contact pads and a connection bus connecting the contact pads. A plurality of devices under test (DUTs) are connected to the connection bus. In some embodiments the DUTs are at a same interconnect level of the device, while in other embodiments the DUTs are at different interconnect levels of the device.

Other embodiments provide methods, e.g. of manufacturing an electronic device or parametric test module, according to embodiments described above.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

Figure 1:
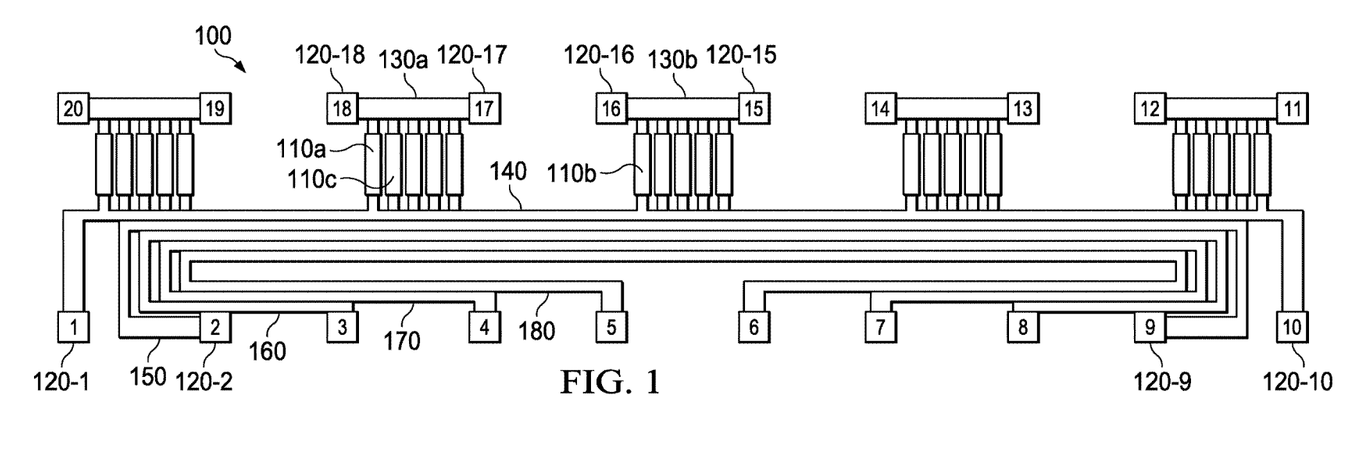
FIG. 1 illustrates a device, e.g. a five-level test module with two rows of ten contact pads, suitable for semiconductor manufacturing according to various embodiments, including multiple devices under test (DUTs) connected to connection buses.
Figure 2A:
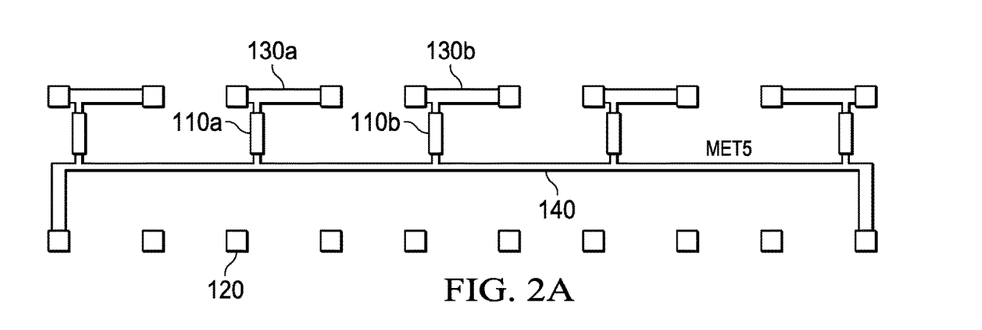
FIGS. 2A-2E illustrate each layer of the example device of FIG. 1.
Figure 2B:
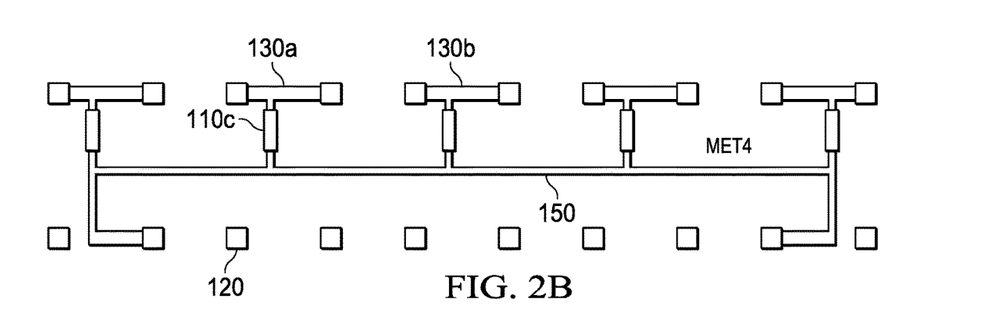
Figure 2C:
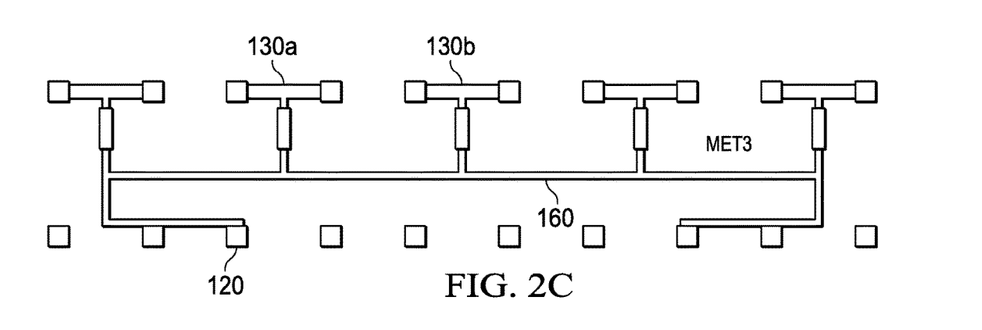
Figure 2D:
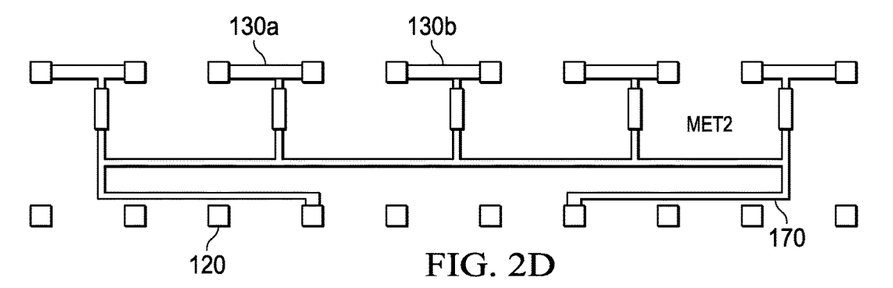
Figure 2E:
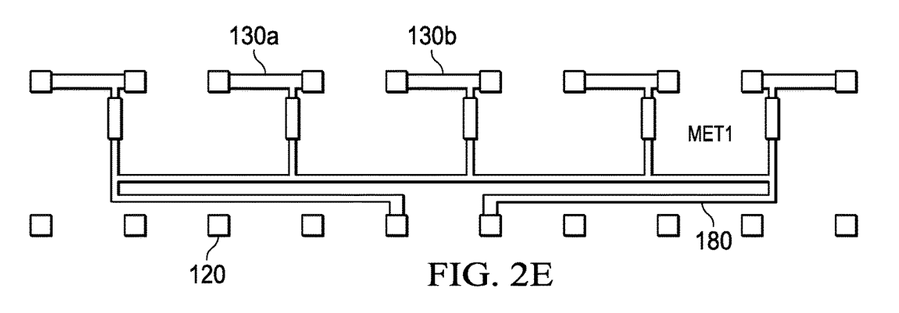

FIG. 1 illustrates an example embodiment of an electronic device 100, e.g. a parametric test module suitable for placement on a semiconductor wafer for parametric testing of devices in a manufacturing flow. The device 100 is shown in a nonlimiting example as a five level device, meaning that it includes test structures 110, referred to herein as devices under test 110, or DUTs 110, placed in five different design levels. Without limitation, the discussion refers to these levels as metal 1 (MET1) through metal 5 (MET5), as may be present in some integrated circuit interconnect levels. The device 100 may serve as a test module in an integrated circuit design, and may be referred to in this discussion as test module 100, or simply module 100. The DUTs are referred to in this discussion by the reference 110, while recognizing the DUTs may be structurally different and may characterize different parameters.

The test module 100 includes an arrangement of contact pads 120, exemplified as a 2×10 array. Other embodiments may include any number of contact pads, which may be placed in arrangements other than a regular array. The contact pads 120 may provide an electrical contact for a test probe to enable parametric characterization of one or more of the DUTs 110. A number of connection buses connect various pairs of the contact pads 120 as further described below. The contact pads 120 are numbered for reference as 1 through 20. A particular contact pad N may be referred to as contact pad 120-N, for example contact pad 120-1 for the contact pad located at the lower left hand corner of the test module 100.

A first connection bus 130*a* connects a first pair of contact pads 120-17 and 120-18, and a second connection bus 130*b* connects a second pair of contact pads 120-15 and 120-16. Each of the buses 130*a*, 130*b* includes a conductive trace at each of the five metal levels between the connected contact pads 120. Similarly connection buses that connect the other neighboring pairs of contact pads 120-19 and 120-20, 120-

15 and 120-16, 120-13 and 120-14, and 120-11 and 120-12, each include metal traces at the five metal levels.

A third connection bus 140 connects contact pads 120-1 and 120-10. The connection bus 140 includes only a single metal level, e.g. MET5. Similarly, a connection bus 150 connects contact pad pair 120-2 and 120-9, a connection bus 160 connects contact pad pair 120-3 and 120-8, a connection bus 170 connects contact pad pair 120-4 and 120-7, and a connection bus 180 connects contact pad pair 120-5 and 120-6. The connection buses 150, 160, 170, 180 each include only one metal level, and may respectively correspond to metal levels MET4, MET3, MET2 and MET1.

FIGS. 2A-2E illustrate each of the design levels of the test module 100 in isolation. First considering FIG. 2A, the connection bus 140 includes one connection to each of a plurality of the DUTs 110a. The illustrated embodiment includes one DUT 110 for each connection bus 130, but in other embodiments there may be fewer DUTs 110 than connection buses 130. Similarly, in FIGS. 2B-2E the corresponding connection bus 150, 160, 170 or 180 includes a connection to one DUT 110 corresponding to each connection bus 130. In the illustrated embodiment connection bus 140 is shown connected to the two outermost contact pads 120-1 and 120-10, the connection bus 150 is connected to the next two outermost contact pads 120-2 and 120-9, and so on for the remaining connection buses 160, 170 and 180. This configuration is but one nonlimiting example of the layout of the connection buses. In general, the connection buses 160-180 may be routed in any manner as needed to implement a particular test module design, taking into account layout design rules that may be enforced for a particular manufacturing flow.

Returning to FIG. 1, in the illustrated embodiment each of the connection buses 130 includes connections to a number of DUTs 110 that corresponds to a number of the connection buses 140-180, e.g. five in the illustrated embodiment. Other embodiments may have fewer DUTs 110 connected to the connection buses 130 than the number of connection buses 140-180. Recalling that each connection bus 130 includes a trace corresponding to the design level of each connection bus 140-180, each connection bus 130 also may be connected to a DUT 110 corresponding to each design level. Thus, in the illustrated example, the connection bus 130a is connected to the DUT 110a at MET5, to the DUT 110c at MET4, and so on for the additional three DUTs 110. Similarly, each of the other connection buses 130 is also connected to one DUT 110 corresponding to each connection bus 140-180. Accordingly the illustrated embodiment includes $N^2$ DUTs 110, where N equals the number of design levels, e.g. metal levels.

In some embodiments the connection levels of the buses 130 may not correspond directly to the design levels of the buses 140-180, such as when the DUTs include via test structures. For example, the connection bus 130a may connect at the MET2 level to a via cross-point structure, and the bus 140 may connect to the same structure at the MET 1 level.

Figure 3:
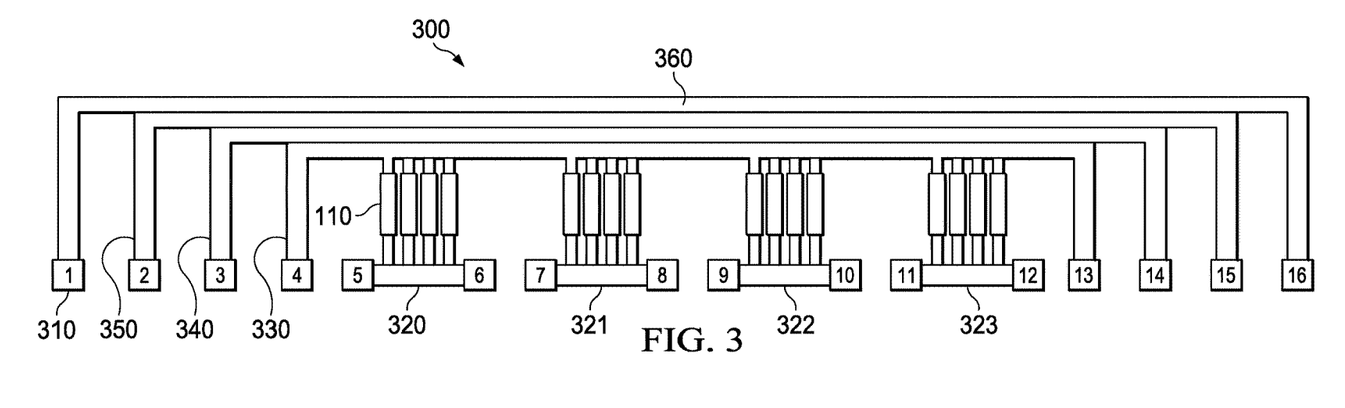
FIG. 3 illustrates a device, e.g. a test module using a single linear array of contact pads.

FIG. 3 illustrates another embodiment of an electronic device 300, or test module 300, in which contact pads 310 are members of a single linear array of contact pads. The test module 300 is presented in this nonlimiting example as having 16 contact pads 310, which may be referred to individually in this discussion by location, e.g. 310-1 through 310-16. A bus 320 connects the contact pins 310-5 and 310-6, a bus 321 connects the contact pins 310-7 and 310-8, a bus 322 connects the contact pins 310-9 and 310-10, and a bus 323 connects the contact pins 310-11 and 310-12. Each of the buses 320-323 includes traces at each of multiple conductive levels that connected the respective contact pad pairs.

The device further includes a plurality of buses 330, 340, 350 and 360 that connect pairs of contact pads 310. The bus 330 connects the contact pads 310-4 and 310-13, the bus 340 connects the contact pads 310-3 and 310-14, the bus 350 connects the contact pads 310-2 and 310-15, and the bus 360 connects the contact pads 310-1 and 310-16. Each of the buses 330-360 is formed at a different conductive level of the test module 300.

The bus 320 is connected to each of four DUTs 110 by way of a conductive trace on an appropriate conductive level, e.g. polysilicon or metal, connected to a first terminal of the corresponding one of the DUTs 110. As before, the DUTs 110 may be structurally different and may characterize different parameters. Each DUT 110 is in turn connected at a second terminal to one of the buses 330-360. Thus, for example, a first one of the DUTs 110 is connected between the bus 320 and the bus 330, a second one of the DUTs 110 is connected between the bus 320 and the bus 340, a third one of the DUTs 110 is connected between the bus 320 and the bus 350, and a fourth one of the DUTs 110 is connected between the bus 320 and the bus 360. Similar sets of DUTs 110 are connected between each of the bus 321 and corresponding ones of the buses 330-360, and similarly for the buses 322 and 323.

Figure 4A:
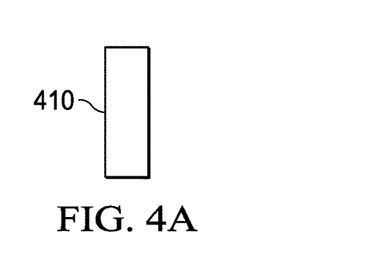
FIGS. 4A-4F illustrate nonlimiting examples of test structures that may be used in the DUTs of the devices illustrated in FIG. 1 and/or FIG. 3.
Figure 4B:
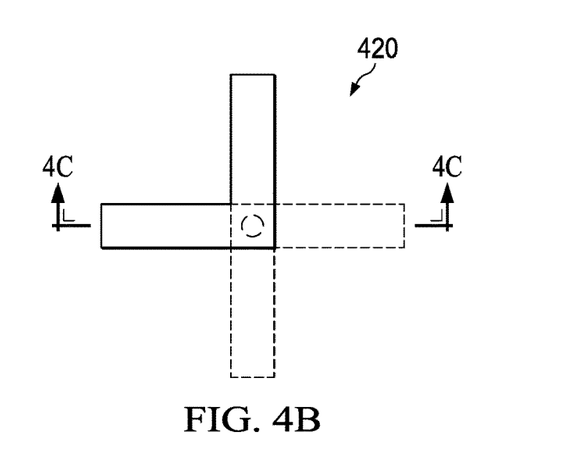
Figure 4C:
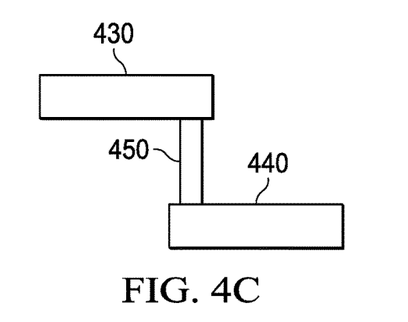
Figure 4D:
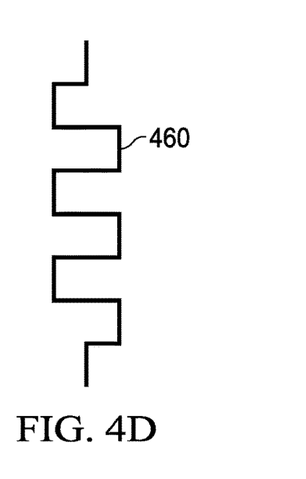
Figure 4E:
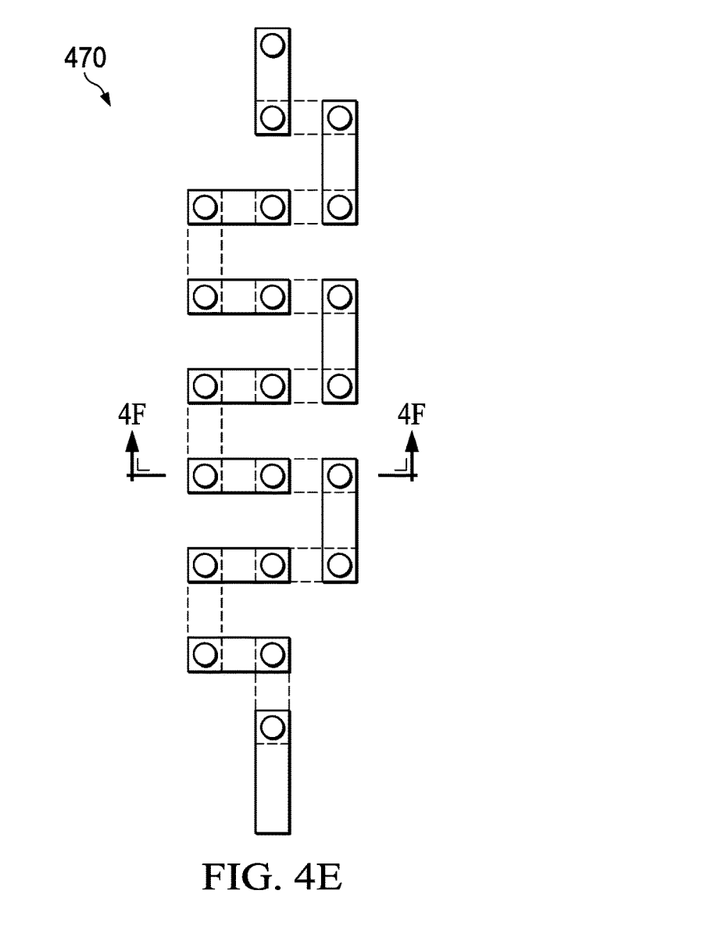
Figure 4F:
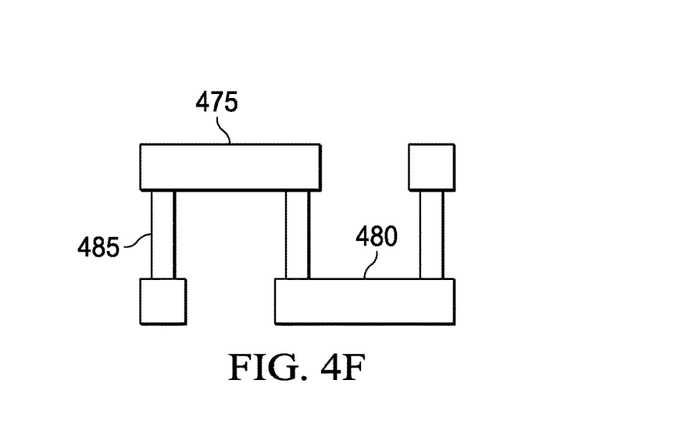

Referring to FIGS. 4A-4D, each of the DUTs may include one of any conventional or newly developed test structure that may determine a parametric test value related to the structure or processing of an electronic device of which the test module 100 is a part. Four examples are shown, with the understanding that other types of test structures may be within the scope of the disclosure. FIG. 4A illustrates in plan view a sheet resistance module 410, e.g. a rectangular plate that may be implemented at any conductor level of a device design, e.g. polysilicon, metal or metal silicide. Metals may include any current or future developed metal type, e.g. aluminum, AlCu alloy, or copper at interconnect levels, or tungsten or cobalt at silicide levels. FIGS. 4B and 4C respectively show in plan and sectional views a via resistance module 420. Conductive levels 430 and 440 form a cross-point structure with a via 450 between the levels. The conductive levels may be polysilicon or metal as appropriate, and the via 450 may be a via between metal levels or a contact between a metal level and a polysilicon level. FIG. 4D illustrates a serpentine resistor 460 that may be used to characterize line unit resistance values at metal, polysilicon or silicide levels. Other DUTs may include, e.g. via chains, capacitors, diffused regions such as buried layers and wells, and source/drain moats. In some embodiments a DUT may include active devices, e.g. two nominally matched transistors such that the mismatch may be characterized. 4E and 4F respectively show in plan and sectional views a via chain module 470 that may be used to determine the average resistance of a large number of vias connected in series.

Returning to FIG. 1, a particular DUT, e.g. the DUT 110a, may be characterized using a four-point measurement, sometimes referred to as a Kelvin measurement. In such a measurement, a current may be caused to flow between two of the contact pads 120 and through the DUT being characterized, and a resulting voltage may be measured across the remaining two contact pads 120. Thus, for example, a current may be run between the contact pad 120-1 and the contact pad 120-17, and a resulting voltage may be measured across the contact pads 120-18 and 120-10. Using appropriate mathematical relationships, a sheet resistance may be determined from the module 410, a via resistance may be determined from the module 420, a unit line resistance may be determined from the module 460, and an average via resistance may be determined from the module 470. A particular instance of the test module 100 may be designed to only characterize one type of parameter, e.g. sheet resistance at various metal levels, or may be designed to characterize more than one type of parameter, e.g. resistance of single vias and of via chains.

Advantageously, embodiments within the scope of the disclosure provide a greater number of DUTs in a test module design than is possible with conventional configurations. For example, some conventional configurations place a characterization structure between adjacent pairs of contact pads in a 2×N/2 array, with each contact pad serving as one contact of a Kelvin measurement. Such a configuration may accommodate N/2−1 DUTs for N contact pads. Thus a conventional 2×10 (N=20) contact pad configuration would accommodate only 9 DUTs, and a 1×16 (N=16) contact pad configuration would accommodate only 7 DUTs. In contrast, test modules within the scope of the disclosure may accommodate $(N/4)^2$ DUTs for N pads. For example, the 2×10 configuration of FIG. 1 may accommodate 25 DUTs, more than doubling the density of DUTs as compared to a conventional 2×10 test module. Similarly the configuration of DUTs and buses in the 1×16 test module 300 of FIG. 3 allows for the placement of N DUTs with N contact pads. In this example N=16, and the test module 300 can include 16 DUTs 110, representing about a 130% increase of the number of DUTs in a single test module as compared to some conventional test module implementations. Thus, fewer test modules may be needed in a particular electronic device design, or more parameters may be characterized in a same space.

Figure 5:
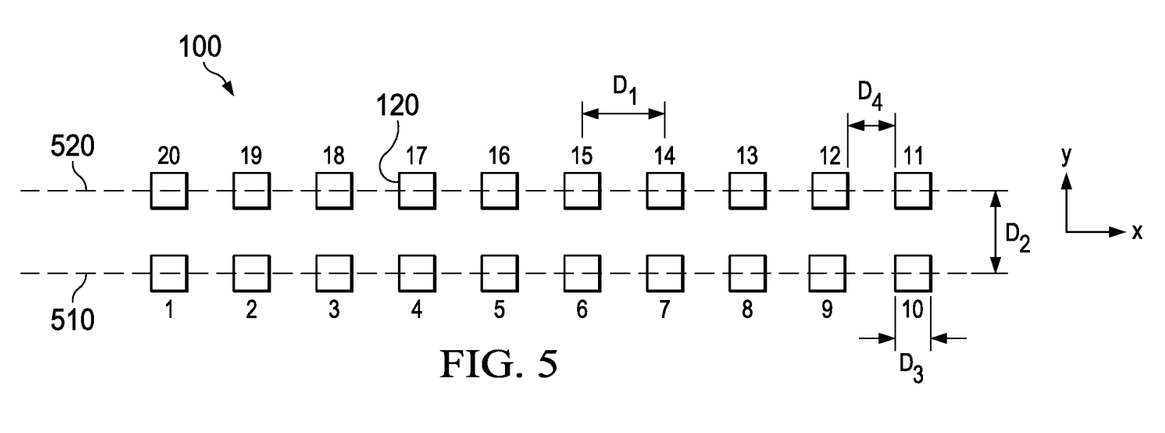
FIG. 5 illustrates a schematic view of contact pad placement in the 2×10 test module of FIG. 1, including various dimensional references.

FIG. 5 illustrates aspects of a physical configuration of the test module 100 according to the illustrated embodiment, with x-y coordinates shown for reference. Contact pads 120-1 through 120-10 are arranged along a first axis 510, and contact pads 120-11 through 120-20 are arranged along a second parallel and non-collinear axis 520. The contact pads 120 are placed with a center-center distance $D_1$ along the x-axis, and a center-center distance $D_2$ along the y-axis. Optionally, $D_1=D_2$, but in some embodiments $D_2$ may be greater than $D_1$, e.g. to provide additional space for routing of the connection buses 150-180 and/or placement of the $DUT_S$ 110. The contact pads 120 further have a width $D_3$, and are spaced apart by a distance $D_4$. Optionally, the contact pads 120 are about square, as illustrated, but other embodiments are possible and contemplated. For example, the contact pads 120 may be longer along the x-axis to allow for greater tolerance of uncertainty of probe contact placement in the x-direction on the contact pads 120. In a nonlimiting embodiment, $D_1$ and $D_2$ are about 100 µm, and $D_3$ and $D_4$ are about 50 µm. In this embodiment the test module is about 950 µm in the x-direction, and about 150 µm in the y-direction.

While shown having a rectilinear 2×10 contact pad configuration, embodiments are not limited to this configuration. In other embodiments, test modules within the scope of the disclosure may in general have a 2×N/2 contact pad configuration, where N≥8. Other embodiments may have any placement of contact pads that provides connectivity to two or more DUTs consistent with the scope of this description. Furthermore the dimensions of the described pads, connection buses and DUTs are not limited to any particular values.

Figure 6:
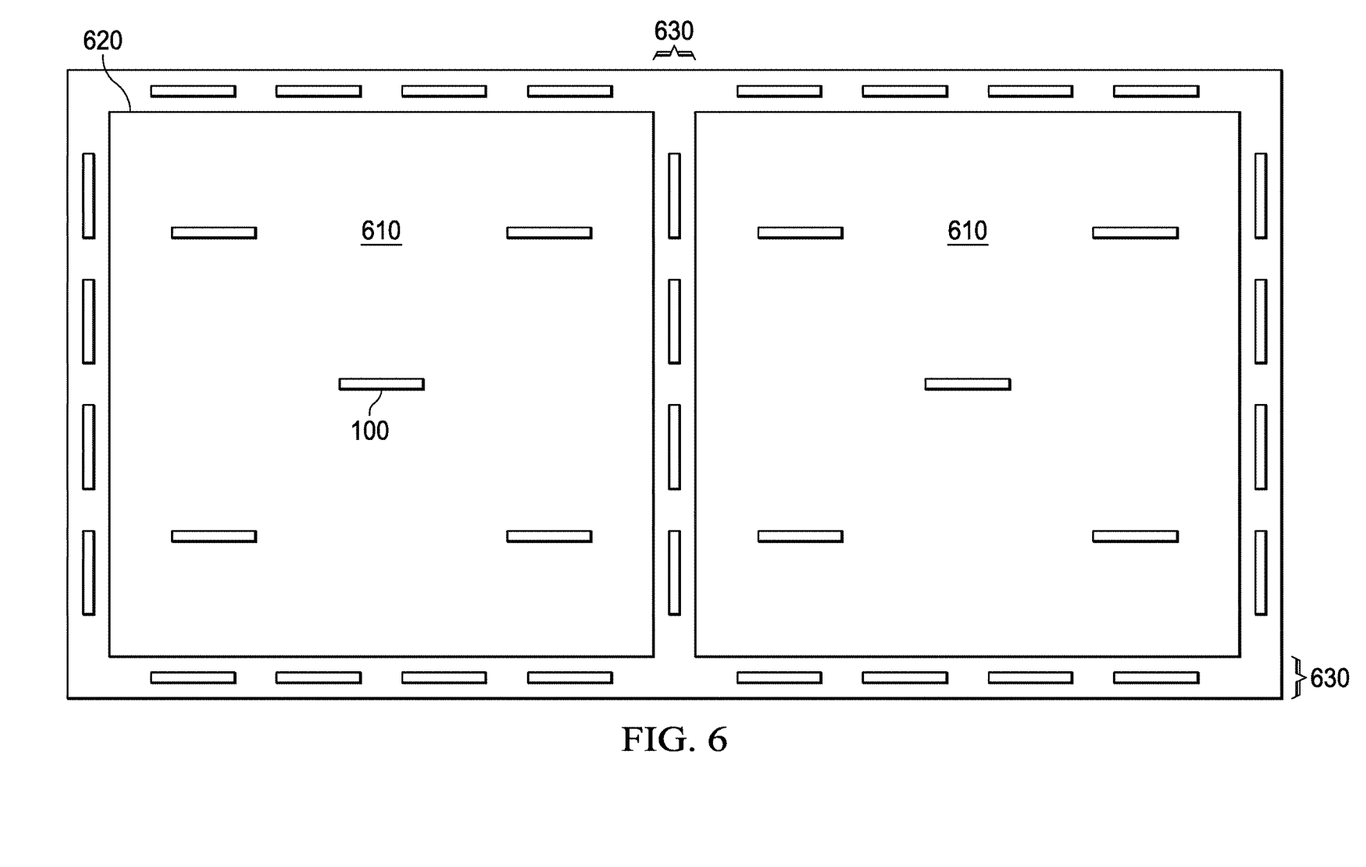
FIG. 6 illustrates two neighboring electronic device die on a device substrate and multiple placements of test modules exemplified by FIG. 1, with a subset of test modules placed within the geometric limits of the device implementation, and a subset of test modules placed in scribe streets between the neighboring die.

FIG. 6 illustrates the placement of multiple instances of the test module 100 on and around two instances of an electronic device 610. The devices 610 may be part of a wafer-level plurality of nominally identical devices in an intermediate stage of manufacturing. A functional area 620 is located inside the geometric limits of the devices 610, and is surrounded by scribe lines 630.

In the illustrated embodiment multiple instances of the test module 100 are placed within the boundaries of the devices 610, and within the scribe lines 630. Different ones of the test modules 100 will typically be designed to measure a different combination of parametric test metrics. For example, some of the test modules 100 may be designed to characterize sheet resistance at one or more design levels, while others may be designed to characterize individual vias or via chains at a same design level. Multiple instances of nominally identical test modules designed to characterize a particular combination of parameters may be placed in different locations within the functional area 620 or the scribe lines 630 for redundancy, repeatability, or to characterize variation across the device 600. The test modules 100 may be electrically probed at one or more intermediate stages of manufacture, and/or at the end of the manufacturing process. Most or all of the material in the scribe lines 620 is removed after completion of the devices 610 when the devices are separated prior to packaging. Thus test modules 100 within the scribe lines 630 will typically be destroyed when manufacturing of the devices 610 is complete.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated circuit, comprising:
   first and second pairs of contact pads arranged along a first axis;
   a third pair of contact pads arranged along a second axis parallel to the first axis;
   a first connection bus on a first metal level connecting contact pads in said first pair, and a second connection bus on a second different metal level connecting contact pads in said second pair;
   a third connection bus connecting contact pads of said third pair;
   a first device under test (DUT) connected between said first connection bus and said third connection bus; and
   a second DUT connected between said second connection bus and said third connection bus.

2. The integrated circuit of claim 1, further comprising:
   a fourth pair of connection pads arranged along said second axis;
   a fourth connection bus connecting contact pads of said fourth pair; and
   a third DUT connected between said first connection bus and said fourth connection bus.

3. The integrated circuit of claim 2, wherein said third and fourth connection buses are on different interconnect levels.

4. The integrated circuit of claim 1, wherein said first and second DUTs are selected from the group consisting of:
   a sheet resistance module;
   a via resistance module; and
   a serpentine resistor.

5. The integrated circuit of claim 1, wherein said connection pads are about 50 µm square and spaced apart along said first and second axes by about 50 µm.

6. The integrated circuit of claim 1, wherein said DUTs are located within the geometric limits of a circuit implementation.

7. A parametric test module, comprising:
a pair of contact pads located over a semiconductor substrate;
a connection bus comprising multiple metal levels connecting said contact pads; and
a plurality of devices under test (DUTs) connected to said connection bus.

8. The parametric test module of claim 1, wherein said pair is a first pair of contact pads, and said connection bus is a first connection bus, and further comprising:
a second connection bus at a first interconnect level connected to a second pair of contact pads and a first of said DUTs; and
a third connection bus at a second different interconnect level connected to a third pair of contact pads and a second of said DUTs.

9. The parametric test module of claim 8, wherein said first pair of contact pads is arranged along a first axis, and said second and third pairs of contact pads are arranged along a second axis parallel to and non-collinear with said first axis.

10. The parametric test module of claim 7, wherein a first DUT includes a first test structure at a first design level, and a second DUT includes a second test structure at a second different design level.

11. The parametric test module of claim 7, wherein said DUTs are selected from the group consisting of:
a sheet resistance module;
a via resistance module; and
a serpentine resistor.

12. The parametric test module of claim 7, wherein said pair of contact pads are members of a linear array of contact pads, and said DUTs each connect to a respective other contact pad in said linear array of contact pads.

13. A method, comprising:
forming first and second contact pads over a circuit substrate;
forming a connection bus comprising multiple metal levels that connects said contact pads; and
forming a plurality of devices under test (DUTs) connected to said connection bus.

14. The method of claim 13, wherein a first DUT includes a first test structure at a first design level, and a second DUT includes a second test structure at a second different design level.

15. The method of claim 13, wherein said pair is a first pair of contact pads, and said connection bus is a first connection bus, and further comprising:
forming a second connection bus at a first interconnect level connected to a second pair of contact pads and a first of said DUTs; and
forming a third connection bus at a second different interconnect level connected to a third pair of contact pads and a second of said DUTs.

16. The method of claim 15, wherein said first pair of contact pads is arranged along a first axis, and said second and third pairs of contact pads are arranged along a second axis parallel to said first axis.

17. The method of claim 13, wherein said DUTs are selected from the group consisting of:
a sheet resistance module;
a via resistance module; and
a serpentine resistor.

* * * * *